(12) United States Patent
Abhishek et al.

(10) Patent No.: US 11,047,904 B2
(45) Date of Patent: Jun. 29, 2021

(54) LOW POWER MODE TESTING IN AN INTEGRATED CIRCUIT

(71) Applicant: NXP USA, INC., Austin, TX (US)

(72) Inventors: Kumar Abhishek, Bee Cave, TX (US); Srikanth Jagannathan, Austin, TX (US); Thomas Henry Luedeke, Oberbergkirchen (DE); Venkannababu Ambati, Austin, TX (US); Mark Shelton Cinque, Austin, TX (US); Joseph Rollin Wright, Round Rock, TX (US)

(73) Assignee: NXP USA, Inc., Austin, TX (US)

( * ) Notice: Subject to any disclaimer, the term of this patent is extended or adjusted under 35 U.S.C. 154(b) by 35 days.

(21) Appl. No.: 16/292,654

(22) Filed: Mar. 5, 2019

(65) Prior Publication Data
US 2020/0284830 A1    Sep. 10, 2020

(51) Int. Cl.
*G01R 31/28* (2006.01)

(52) U.S. Cl.
CPC ....... *G01R 31/286* (2013.01); *G01R 31/2879* (2013.01); *G01R 31/2882* (2013.01)

(58) Field of Classification Search
CPC .............. G01R 31/286; G01R 31/2882; G01R 31/2879
See application file for complete search history.

(56) References Cited

U.S. PATENT DOCUMENTS

| | | | |
|---|---|---|---|
| 6,052,746 A | 4/2000 | Kalluri et al. | |
| 7,756,197 B1 | 7/2010 | Ferguson et al. | |
| 8,168,970 B2 | 5/2012 | Whetsel et al. | |
| 9,733,309 B2 | 8/2017 | Li | |
| 2007/0046369 A1* | 3/2007 | Schober | G06K 19/0713 330/7 |
| 2007/0090848 A1* | 4/2007 | Tumin | G01R 31/3172 324/762.02 |
| 2008/0272826 A1 | 11/2008 | Smit et al. | |
| 2010/0156458 A1* | 6/2010 | Speers | H03K 19/17772 326/39 |
| 2011/0148945 A1* | 6/2011 | Matsuda | H03M 1/76 345/690 |
| 2013/0047016 A1* | 2/2013 | Singh | G06F 1/3206 713/323 |

(Continued)

FOREIGN PATENT DOCUMENTS

JP    2011-7591 A    1/2011

*Primary Examiner* — Akm Zakaria (57) ABSTRACT

An integrated circuit includes a plurality of external terminal circuits, each having an external terminal. The integrated circuit includes a wakeup detector including a plurality of inputs. Each input of the plurality of inputs is coupled to an external terminal circuit. The wakeup detector generates an output signal indicative of an external terminal of the plurality of external terminal circuits being placed at a wakeup voltage. The integrated circuit includes a trigger generation circuit having a plurality of outputs in which each output is coupled to an external terminal circuit to generate a wake-up voltage at an external terminal of the external terminal circuit by coupling the external terminal to a power supply terminal of the integrated circuit to generate an indication of the external terminal being at the wakeup voltage at the wakeup detector when at least a portion of the integrated circuit is in a low power mode.

19 Claims, 5 Drawing Sheets

(56) References Cited

U.S. PATENT DOCUMENTS

2016/0164284 A1* 6/2016 Kayama .............. H02J 2207/40
307/113
2019/0079575 A1* 3/2019 Hanson ................. G06F 1/3237

* cited by examiner

LOW POWER MODE TESTING IN AN INTEGRATED CIRCUIT

BACKGROUND

Field

This disclosure relates generally to integrated circuits, and more specifically, to low power mode testing of an integrated circuit.

Related Art

During manufacturing of integrated circuits, probe testing is commonly performed to ensure proper operation of various aspects of the integrated circuit (IC). The probes during probe testing contact the input/output pads of the integrated circuit in order for an external tester to apply test stimulus and receive test responses to determine proper operation of the IC. For example, probe testing can be split into four categories, including digital logic testing (such as built-in self-testing (BIST)), AC testing, analog testing, and low power mode testing. For BIST, probes may be used to verify such things as logic on the IC, memory and I/O functionality, etc. This may include, for example, boundary scan testing. For AC testing, probes may be used to perform, for example, timing and delay testing, and high-speed interface testing. For analog testing, probes may be used to determine the linearity/dynamic performance of analog-to-digital converters (ADCs) and perform analog reference checks.

For low power mode testing, probes may be used to determine if the low power architecture of the IC is functional, such as by performing current consumption measurements (also referred to as IDD measurements) and by determining if the IC correctly functions in low power mode and correctly enters into and exits out of low power mode. For example, probe testing should verify whether all pads of an IC (such as in a system on a chip (SoC)) that are capable of receiving a wakeup trigger signal to wake up the IC do in fact wake up the IC upon receipt of a wakeup trigger signal which is provided by a probe. However, as ICs continue to increase in complexity, more I/O pads are included which need probe testing, and each I/O pad needs to be contacted with a probe to apply a wakeup trigger signal to ensure that low power mode testing is complete. As the need for probes to contact more I/O pads increases, test time and test cost also increases. Therefore, a need exists for improved low power mode testing.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

As discussed above, as the number of I/O pads which need to be contacted by a probe during probe testing of an IC increases, so does testing cost and time. In one aspect, reduction in test cost can be achieved with increased parallelism. Parallelism, or the ability to test more ICs during probe testing, can be achieved by reducing the number of I/O pads (i.e. pins) needed to be contacted by a probe during probe testing. Therefore, on-chip resources (such as SoC debug features) may be re-used during probe testing, such as low power or analog testing, which results in a reduced number of I/O pads needing contact with a probe. For example, in one embodiment, rather than a wakeup trigger being asserted on an I/O pad by a probe, a wakeup trigger generation circuit selectively provides trigger generation signals to the pad circuits to internally generate wakeup voltages on the I/O pads, as needed. As will be discussed blow, a wakeup voltage is the voltage at the I/O pad that can be translated into a digital wakeup signal to the SoC. In this manner, low power mode testing to ensure that the SoC, or portions thereof, properly enter and exit a low power mode or satisfy proper current consumption limits during low power mode can be done in a more efficient manner.

Figure 1:
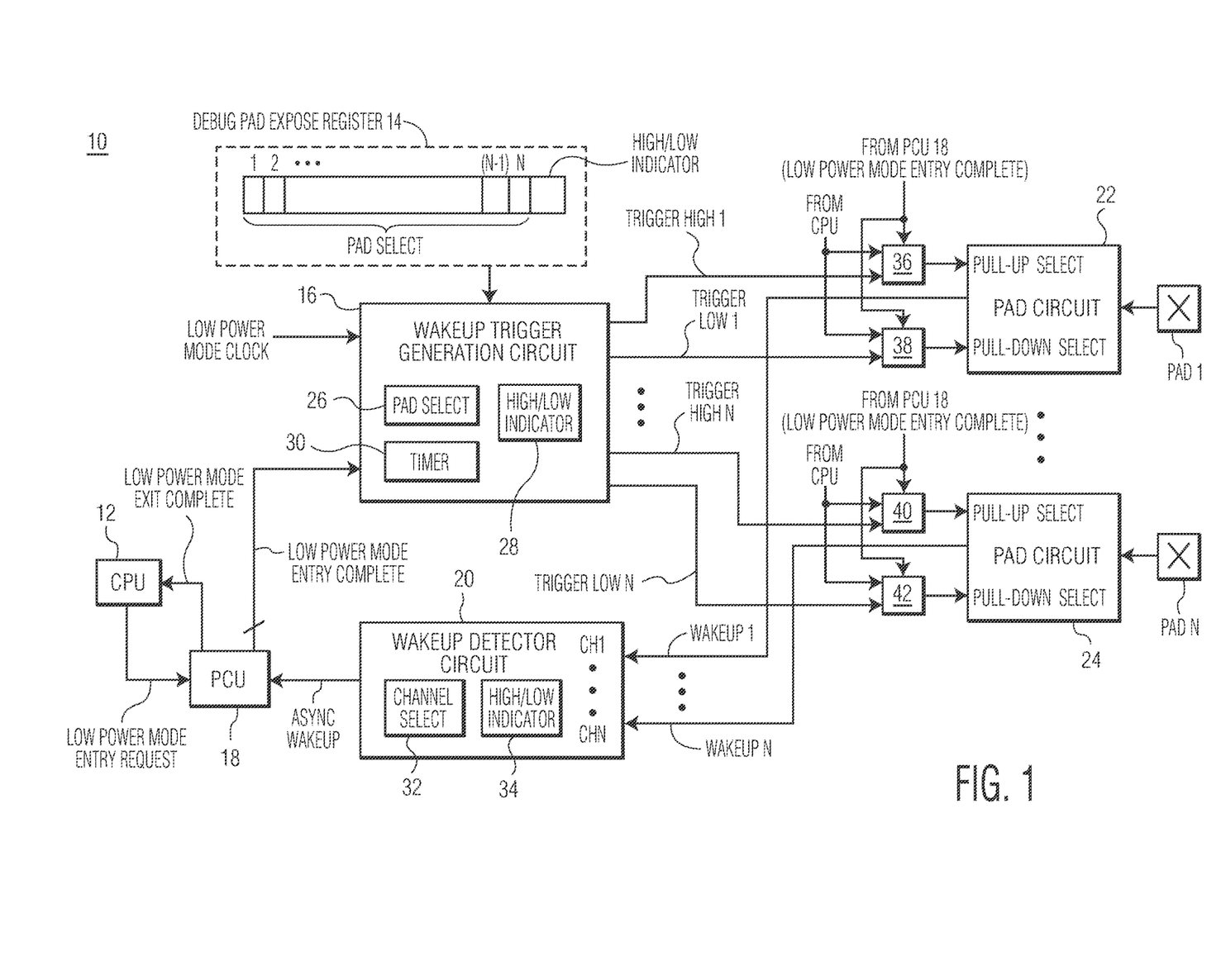
FIG. 1 illustrates, in block diagram form, an IC in accordance with one embodiment of the present invention.

FIG. 1 illustrates, in block diagram form, IC 10, in accordance with one embodiment of the present invention. IC 10 may be a system on a chip (SoC) or a portion of an SoC and may therefore also be referred to as SoC 10. IC 10 includes a pad expose register 14, a wakeup trigger generation circuit 16, a central processing unit (CPU) 12, a power control unit (PCU) 18, a wakeup detector circuit 20, multiplexors (MUXes) 36, 38, 40, and 42, N pad circuits (including pad circuits 22 and 24), and N pads (pad 1-pad N). Each of pads 1-N is coupled to a corresponding pad circuit of the N pad circuits, in which N is any integer greater than or equal to one. For example, pad 1 is coupled to corresponding pad circuit 22, and pad N is coupled to corresponding pad circuit 24. Each of pads 1-N can be referred to as a general purpose I/O pad (GPIO), in which each GPIO can be configured to be only an input pad, only an output pad, or both an input and an output pad. The pads 1-N can also be referred to as external terminals since they provide external access to or from IC 10.

Pad circuits 1-N provide corresponding wakeup signals 1-N to wakeup detector circuit 20. Each pad circuit receives a first input from a first MUX and a second input from a second MUX. The first MUX receives one or more signals from CPU 12 and also receives a corresponding Trigger High signal from wakeup trigger generation circuit 16. The second MUX receives one or more signals from CPU 12 and also receives a corresponding Trigger Low signal from wakeup trigger generation circuit 16. Each of the first and second MUXes also receives a select signal from PCU 18 which allows each of the Trigger High and Trigger Low signals to be provided to the corresponding pad circuit. For example, MUX 36 receives Trigger High 1 from wakeup trigger generation circuit 16 and one or more other signals from CPU 12. The select signal from PCU 18 can be provided to select the Trigger High 1 signal as the output of MUX 38 and provided to pad circuit 22. MUX 38 receives Trigger Low 1 from wakeup trigger generation circuit 16 and one or more other signals from CPU 12. The select signal from PCU 18 can be provided to select the Trigger Low 1 signal as the output of MUX 38 and provided to pad circuit 22. Similarly, MUX 40 receives Trigger High N from wakeup trigger generation circuit 16 and one or more other signals from CPU 12. The select signal from PCU 18 can be provided to select the Trigger High N signal as the output of MUX 40 and provided to pad circuit 24. MUX 42 receives Trigger Low N from wakeup trigger generations circuit 16 and one or more other signals from CPU 12. The select signal from PCU 18 can be provided to select the Trigger Low N signal as the output of MUX 42 and provided to pad circuit 24. Note that the trigger high signal can be referred to as a high voltage generation output of wakeup trigger generation circuit 16 and the trigger low signal can be referred to as a low voltage generation output of wakeup trigger generation circuit 16.

Pad expose register 14 may be a debug register that is reused for low power mode testing during probe testing. Therefore, pad expose register 14 may also be referred to as debug pad expose register 14 (and may be implemented with any storage circuit). Wakeup trigger generation circuit 16 is coupled to pad expose register 14, receives the low power mode entry complete indicator from PCU 18, and receives a low power mode clock. Wakeup trigger generation circuit 16 also includes a pad select storage circuit 26, a high/low indicator storage circuit 28, and a timer 30. Wakeup detector circuit 20 has N channel inputs and receives each of wakeup signals 1-N at corresponding channel inputs, 1-N. Wakeup detector circuit 20 includes a channel select storage circuit 32 and a high/low indicator storage circuit 34 and provides an asynchronous (async) wakeup signal to PCU 18. PCU 18 provides a low power mode exit complete indicator to CPU 12 and receives a low power entry request signal from CPU 12.

Figure 2:
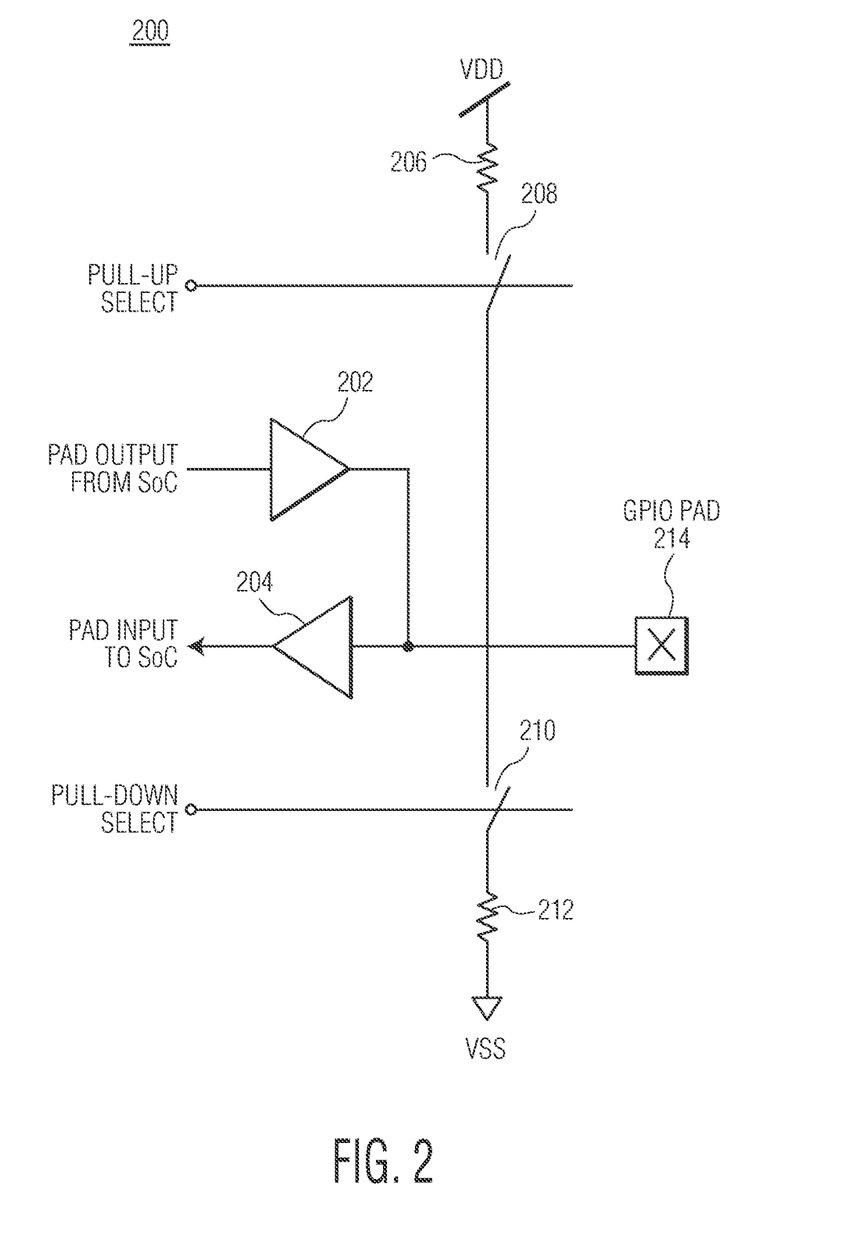
FIG. 2 illustrates, in partial block diagram and partial schematic form, a pad circuit of the IC of FIG. 1, in accordance with one embodiment of the present invention.

FIG. 2 illustrates, in partial block diagram and partial schematic form, a GPIO pad circuit 200 coupled to a GPIO pad 214. GPIO pad 214 and pad circuit 200 can correspond to any of pad circuits and pads referred to in FIG. 1 and can be collectively referred to as an external terminal circuit. Pad circuit 200 includes resistors 206 and 212, switches 208 and 210, and buffers 202 and 204. A first terminal of resistor 206 is coupled to VDD, and a second terminal of resistor 206 is coupled to a first terminal of switch 208. A second terminal of switch 208 is coupled to GPIO pad 214, and a control input of switch 208 is coupled to receive a pull-up select signal which, when asserted, closes switch 208 such that switch 208 is in a conductive state, connecting its first and second terminals, and when negated, opens switch 208 such that switch 208 is in a non-conductive state, disconnecting its first and second terminals. A first terminal of switch 210 is coupled to GPIO pad 214, and a second terminal of switch 210 is coupled to a first terminal of resistor 212. A second terminal of resistor 212 is coupled to VSS. A control input of switch 210 is coupled to receive a pull-down select signal which, when asserted, closes switch 210 such that switch 210 is in a conductive state, connecting its first and second terminals, and when negated, opens switch 210 such that switch 210 is in a non-conductive state, disconnecting its first and second terminals. An input of buffer 202 is coupled to receive a pad output from IC 10, and an output of buffer 202 is coupled to GPIO pad 214. An input of buffer 204 is coupled to GPIO pad 214, and an output of buffer 204 is coupled to provide a pad input to IC 10. In the case that GPIO 214 is only an input pad, buffer 202 may not be present.

During normal operation of IC 10, when not in a low power mode, GPIO pad 214 can receive inputs from pad 214 and provide outputs to pad 214, via buffers 204 and 202, respectively. In this case, the pull-up select and pull-down select signals are negated such that both switches 208 and 210 are open, or non-conductive. Alternatively, during normal operation, the pull-up select or pull-down select signal can be asserted such that pad 214 is not left floating. During a low power mode of IC 10, the input received by input buffer 204 and provided as inputs to IC 10 can be generated by asserting one of the pull-up select signal or the pull-down select signal to bias pad 214 appropriately, rather than receiving an external signal on pad 214 from a tester probe. That is, in low power mode, by closing switch 208, a logic level high signal can be input into buffer 204, and by closing switch 210, a logic level low signal can be input into buffer 204. Therefore, the voltage on pad 214 obtained by asserting one of the pull-up or pull-down select signals may be referred to as the wakeup voltage which is translated to a digital high or low wakeup signal, respectively, at the output of buffer 204. Note that during normal operation, pad circuit 200 operates at a first drive strength and a first current bias condition, but when IC 10 operates in low power mode, pad circuit 200 may operate at a second drive strength, lower than the first drive strength, and at a second current bias condition, lower than the first current bias condition.

Operation of IC 10 will be described in reference to method 300 of FIG. 3 and the timing diagram of FIG. 4. For a low power mode test, IC 10, or portions thereof, are placed in a low power mode in which tests, such as current consumption tests, can be performed to ensure that IC 10 is correctly operating in low power mode (e.g. not surpassing current consumption limitations). It is also necessary to test that IC 10 properly exits low power mode when wakeup signals are received via those GPIO pads configured to receive wakeup signals, whether they are active-high or active-low wakeup signals. Therefore, prior to entering low power mode, appropriate control values are set up within IC 10, while IC 10 is still operating in normal mode and the resources are available. For example, this may include loading registers within IC 10 and latching values from those registers into storage circuits retain their contents during low power mode.

Figure 3:
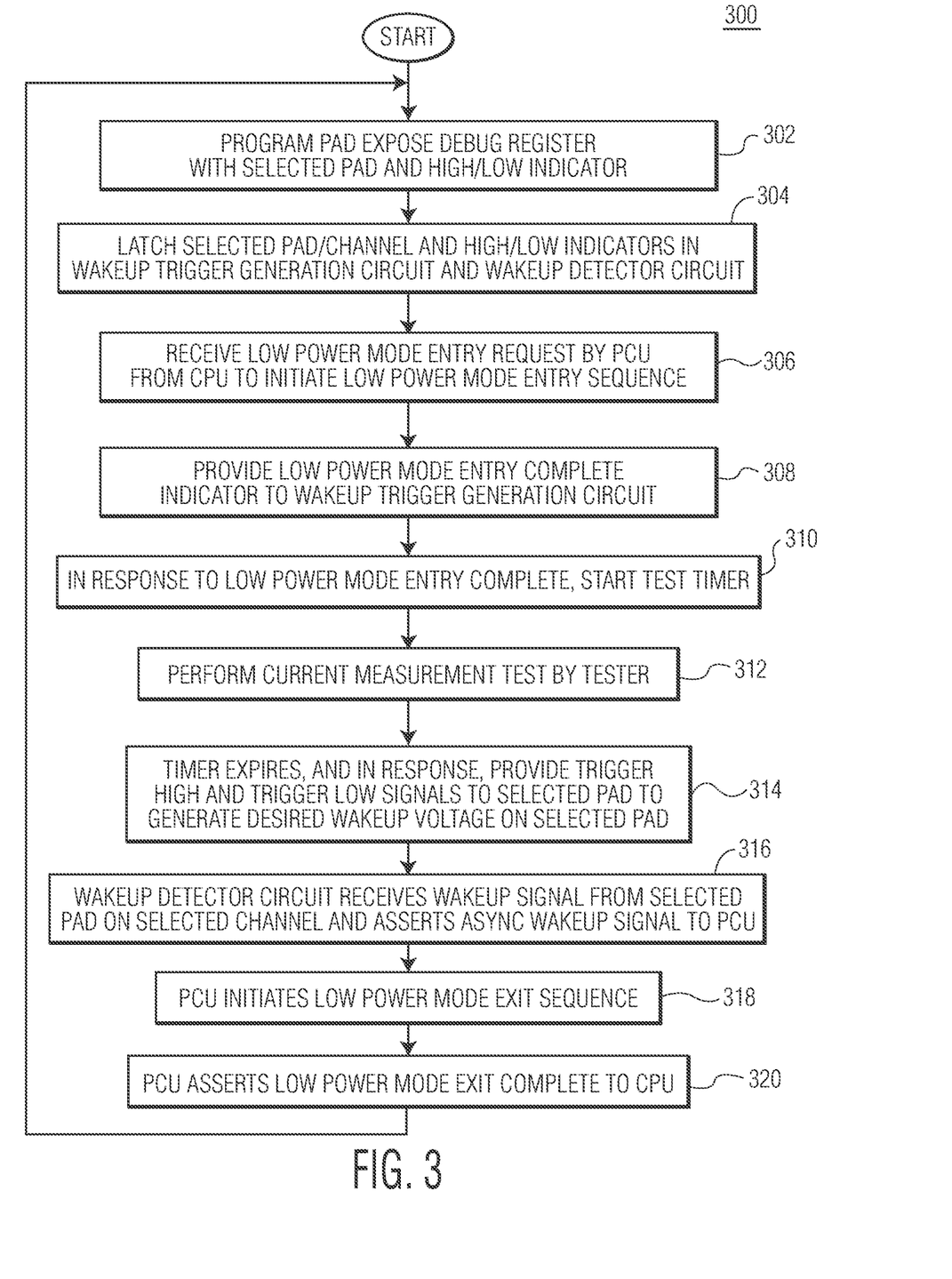
FIG. 3 illustrates, in flow diagram form, a method of operating the IC of FIG. 1, in accordance with one embodiment of the present invention.

For example, referring to block 302 of FIG. 3, pad expose register 14 is loaded with an appropriate pad select indicator and a corresponding high/low indicator. As illustrated in FIG. 1, pad expose register 14 includes a pad select field which includes a pad select indicator for each of the N pads of IC 10 and a high/low indicator field. Each pad of IC 10, which is capable of receiving a wakeup signal, can be selected, in turn, for low power mode testing. Therefore, one of the N pads of IC 10 can be selected by storing a logic level one to the corresponding pad select indicator in register 14. Also, a corresponding high/low indicator can be stored in the high/low indicator field of register 14, in which, in one embodiment, a logic level one indicates that the wakeup signal received on the selected pad is an active-high signal (indicating that a logic level high wakeup signal should trigger a wakeup of IC 10) and a logic level zero indicates that the wakeup signal received on the selected pad is an active-low signal (indicating that a logic level low wakeup signal should trigger a wakeup of IC 10).

In one embodiment, expose register 14 is part of debug circuitry of IC 10. The debug circuitry, including expose register 14, is not operational or accessible during low power mode. Therefore, as indicated in block 304 of method 300, prior to entering low power mode, the selected pad indicated by pad exposure register 14 along the high/low indicator of pad exposure register 14 are latched into pad select 26 and high/low indicator 28, respectively, of wakeup trigger generation circuit 16, and into channel select 36 and high/low indicator 34, respectively, of wakeup detector circuit 20. Note that, at this time, a timer value can also be stored in timer 30 in preparation for low power mode testing. During low power, both wakeup trigger generation circuit 16 and wakeup detector circuit 20 are operational, and therefore, the selected pad and corresponding high/low indicator are kept functional in these respective circuits even when in low power mode.

At block 306 of FIG. 3, a low power entry request is received by PCU 18 from CPU 12, requesting that IC 10 or portions of IC 10 enter the low power mode. In response to the request, PCU 18 initiates the low power entry sequence. That is, PCU 18 initiates the sequence required within IC 10 to enter the low power mode. Upon completing the sequence and entering the low power mode, PCU 18 asserts the low power mode entry complete signal which is received by wakeup trigger generation circuit 16 (as indicated in block 308). In response to assertion of the low power mode entry complete signal, wakeup trigger generation circuit 16 starts test timer 30 (as indicated in block 310). While timer 30 is counting, prior to expiration, current measurement tests can be performed by an external tester in order to, for example, determine current consumption while IC 10 is operating in low power mode. Alternatively, other or additional tests may be performed.

At block 314, in response to timer 30 expiring, the appropriate trigger high and trigger low signals, indicated by high/low indicator 28, are provided to the selected pad, indicated by pad select 26, in order to generate the desired wakeup voltage on the selected pad. For example, if pad select 26 indicates pad 1, then trigger high 1 and trigger low 1 are provided to MUXes 36 and 38, respectively. MUXes 36 and 38 may receive a control signal from PCU 18 (such as the low power mode entry complete signal itself) to select the trigger high 1 and trigger low 1 inputs, respectively, to be provided to the pull-up select input and pull-down select input, respectively, of pad circuit 22. If trigger high/low indicator 28 indicates a trigger high, then trigger high 1 is asserted and trigger low 1 is negated such that the pull-up switch (corresponding to switch 208 within pad circuit 22) is closed and the appropriate logic level high voltage is provided by VDD via resistor 206 to input buffer 204. If, on the other hand, trigger high/low indicator 28 indicates a trigger low, then trigger low 1 is asserted and trigger high 1 is negated such that the pull-down switch (corresponding to switch 212 of pad circuit 22) is closed such that the appropriate logic level low voltage is provided by VSS via resistor 212 to input buffer 204. The appropriate wakeup voltage is provided via buffer 204 as the wakeup 1 signal to wakeup detector circuit 20. Note that if, for example, pad select 26 indicates a different pad, such as pad 3, then the appropriate trigger high 3 and trigger low 3 signals would be provided to the corresponding pad circuit for pad 3. In this example, the appropriate wakeup voltage is provided via the input buffer of the pad circuit for pad 3 as the wakeup 3 signal to wakeup detector circuit 20.

Wakeup detector circuit 20, using channel select 36, monitors the appropriate channel to determine if the appropriate wakeup signal is received. For example, in the case of pad select 26 and channel select 36 indicating pad 1, wakeup detector circuit 20 monitors its ch1 input at which it expects to receive the wakeup 1 signal. Also, high/low indicator 34 indicates whether the wakeup 1 signal is expected to be a logic level high or logic level low. Assuming wakeup detector circuit 20 receives the expected wakeup signal on ch1, wakeup detector circuit 20, in block 316, asserts the async wakeup signal which is provided to PCU 18. In block 318, in response to the asserted async wakeup signal, PCU 18 initiates a low power exit sequence. Then, in block 320, after PCU 18 completes the low power exit sequence, PCU 18 asserts the low power mode exit complete signal which is provided to CPU 12. If CPU 12 properly exits the low power mode, then the wakeup signal was properly received from the pad circuit selected by pad expose register 14. If CPU 12 does not properly exit the low power mode, then an error occurred in the communication of a wakeup signal from the selected pad back to PCU 18. In this manner, each pad can be tested, in turn, via pad expose register 14 by repeating method 300 with a different selected pad. Furthermore, each pad can be tested without needing a probe contacting the corresponding GPIO pad itself since the appropriate wakeup signal is generated via the pull-up and pull-sown select switches rather than an input probe on the pad. This reduces the number of probes needed and thus enabled increased testing parallelism and improved testing efficiency.

Figure 4:
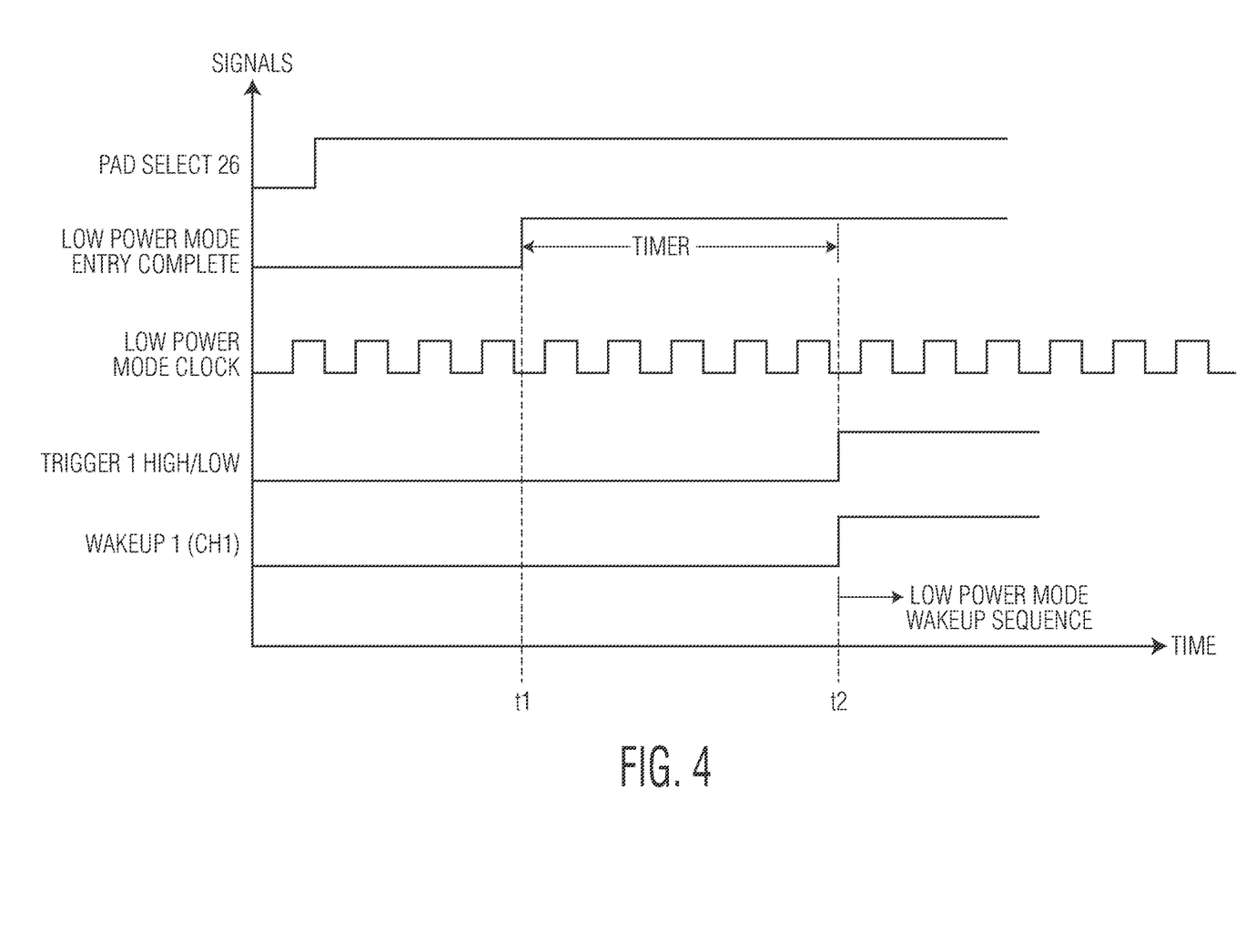
FIG. 4 illustrates a timing diagram of various signals in the IC of FIG. 1, in accordance with one embodiment of the present invention.

FIG. 4 illustrates, in timing diagram form, various signals of IC 10, including pad select 26, the low power mode entry complete signal, the low power mode clock, trigger 1 high/low signal, and a wakeup signal (corresponding to wakeup 1 on channel 1, ch1, of wakeup detector circuit 20. The first signal from the top refers to pad select 26, whose assertion to a logic level one indicates when pad select 26 (and high/low indicator 28) are latched from debug pad expose register 14. At time t1, the low power entry signal is asserted by PCU 18. In response to this assertion, timer 30 in wakeup trigger generation circuit 16 starts counting a predetermined window of time, which ends at time t2. During this time, as described above, low power mode testing can be performed by an external tester, such as current consumption tests. The length of time provided by the timer value of timer 30 can be set or adjusted as needed based on the low power mode testing needed during that time, but should end prior to entering the low power mode. This can be done, for example, by CPU 12. In the illustrated embodiment, timer 30 counts down its timer value using the low power mode clock. At time t2, when timer 30 expires, the appropriate trigger high/low signals are provided to the appropriate pad circuit. For example, the assertion of the trigger 1 high/low signals in FIG. 4 indicates that the appropriate values of trigger 1 high and trigger 1 low are provided to pad circuit 22 based on high/low indicator 28. In this example, it is assumed that trigger 1 high is asserted and trigger 1 low is negated such that an active high wakeup signal is provided as wakeup 1 on channel 1 of wakeup detector circuit 20. Therefore, in FIG. 4, at time t2, the appropriate wakeup voltage is provided at pad 214 based on trigger 1 high and trigger 1 low, and in response thereto, the wakeup 1 signal on channel 1 is asserted. This initiates the low power mode wakeup sequence (and results in assertion of the async wakeup signal).

Figure 5:
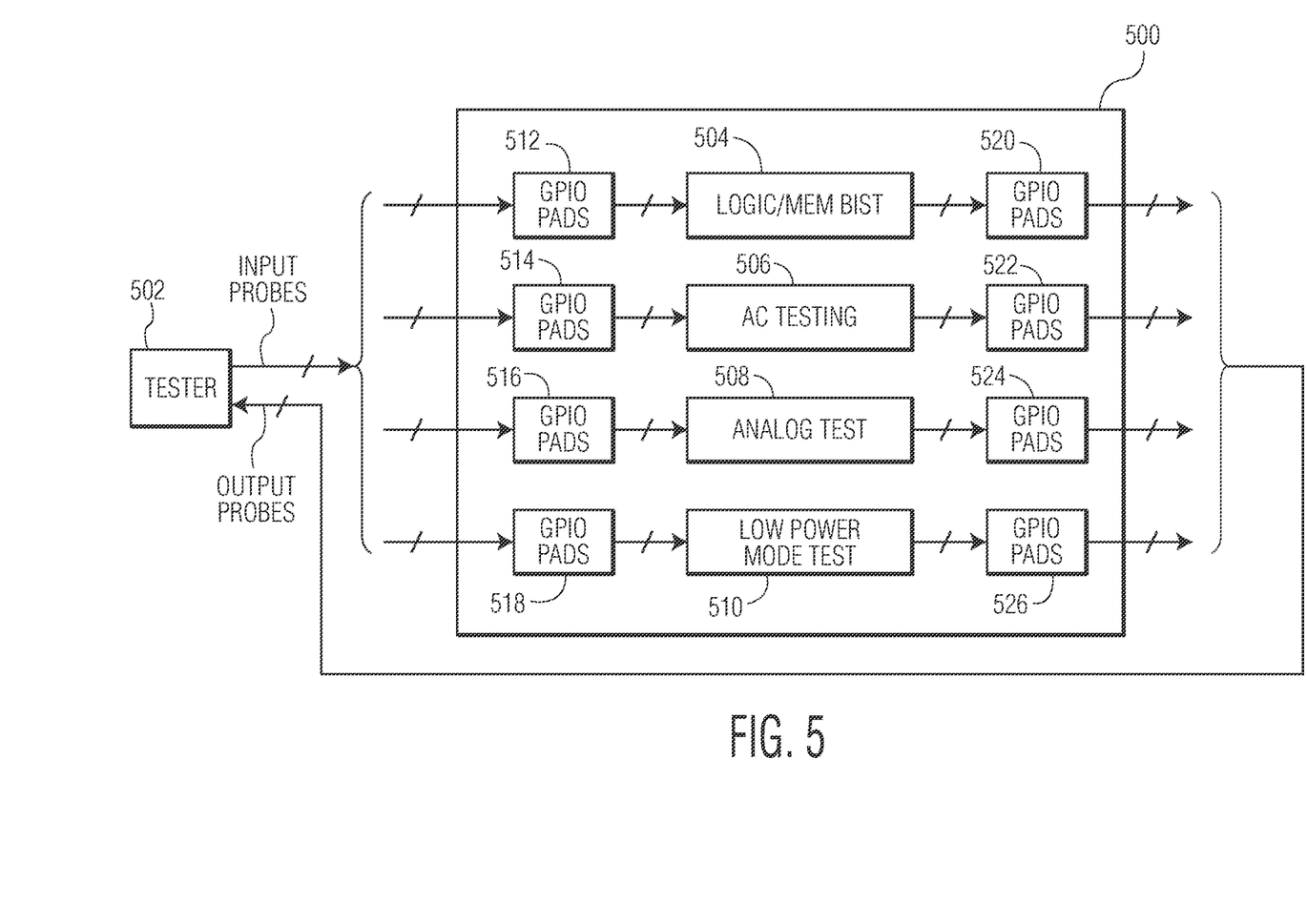
FIG. 5 illustrates, in block diagram form, a system on a chip (SoC) in accordance with one embodiment of the present invention.

FIG. 5 illustrates, in block diagram form, an SoC 500, in accordance with one embodiment of the present invention. SoC 500 includes a plurality of GPIO pads 512, 514, 516, 518, 520, 522, 524, and 526, a logic/memory BIST circuit 504, an AC testing circuit 506, an analog test circuit 508, and a low power mode test circuit 510. SoC 500 is coupled to an external tester 502 via input and output probes which can each contact GPIO pads of SoC 500 as needed. BIST circuit 504 is coupled to GPIO pads 512 which are configured to receive test inputs via input probes of tester 502 and coupled to GPIO pads 520 which are configured to provide test outputs via output probes to tester 502. AC testing circuit 506 is coupled to GPIO pads 514 which are configured to receive test inputs via input probes of tester 502 and coupled to GPIO pads 522 which are configured to provide test outputs via output probes to tester 502. Analog test circuit 508 is coupled to GPIO pads 516 which are configured to receive test inputs via input probes of tester 502 and coupled to GPIO pads 524 which are configured to provide test outputs via output probes to tester 502. Any known circuitry can be used within test circuits 504, 506, and 508.

Low power mode test circuit 510 is coupled to GPIO pads 518 which are configured to receive test inputs via input probes of tester 502 and coupled to GPIO pads 526 which are configured to provide test outputs via output probes to tester 502. Each of GPIO pads 518 and GPIO pads 526 can be implemented with the pad circuits as illustrated in FIGS. 1 and 2. Low power mode test circuit 510 may include any low power mode test circuitry in which tester 502 can use input and output probes as needed to contact any of GPIO pads 518 and 526. Low power mode test circuit 510 may include a wakeup trigger generation circuit such as wakeup trigger generation circuit 16 and a wakeup detector circuit such as wakeup detector circuit 20 and may also include the test circuitry required to take current measurements during low power mode. SoC 500, like IC 10, may include any other circuitry, including a PCU, CPU, debug circuitry which may include the debug pad expose register, etc., or any other circuitry as needed.

Therefore, by now it can be appreciated how the use of a wakeup trigger generation circuit to generate appropriate wakeup signals at selected GPIO pads during a low power test mode allows for the entry into and exit from low power mode to be tested without the need to contact probes themselves to those GPIO pads. This increases testing efficiency and allows for increased testing parallelism. Also, a timer mechanism in the wakeup trigger generation circuit allows for a window of time when other low power mode tests can be performed, in which current consumption measurements can be made.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Also, for example, in one embodiment, the illustrated elements of IC 10 are circuitry located on a single integrated circuit or within a same device. Alternatively, system 10 may include any number of separate integrated circuits or separate devices interconnected with each other.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, different circuitry other than or in addition to the pull-up and pull-down switches may be used within the pad circuits to internally generate the appropriate wakeup voltage on the GPIO pad based on the trigger high and low inputs. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, an integrated circuit includes a plurality of external terminal circuits, each external terminal circuit of the plurality including an external terminal; a wakeup detector including a plurality of inputs, each input of the plurality of inputs is coupled to an external terminal circuit of the plurality of external terminal circuits, wherein the wakeup detector generates an output signal indicative of an external terminal of the plurality of external terminal circuits being placed at a wakeup voltage; a trigger generation circuit, the trigger generation circuit including a plurality of outputs, each output of the plurality of outputs coupled to an external terminal circuit of the plurality to generate a wake up voltage at an external terminal of the external terminal circuit by coupling the external terminal to a power supply terminal of the integrated circuit to generate an indication of the external terminal being at the wakeup voltage at the wakeup detector when at least a portion of the integrated circuit is in a low power mode. In one aspect of this embodiment, the generation of the output signal indicative of an external terminal of the plurality of external terminal circuits being placed at a wakeup voltage causes the at least a portion of the integrated circuit to exit the low power mode. In another aspect, when the at least a portion of the integrated circuit is in the low power, each external terminal circuit of the plurality operates at a first drive strength and at a first current bias condition, wherein when the at least a portion of the integrated circuit is in a normal operating mode, the each external terminal circuit operates at a second drive strength and at a second current bias condition, wherein the second drive strength is higher than the first drive strength and the second current bias condition is higher than the first current bias condition. In another aspect, the trigger generation circuit selectively asserts a signal on an output of the plurality of outputs to generate a wakeup voltage at an external terminal of a selected external terminal circuit of the plurality of external terminal circuits. In yet another aspect, the plurality of outputs of the trigger generation circuit includes a plurality of high voltage generation outputs and a plurality of low voltage generation outputs, wherein each high voltage generation output of the plurality of high voltage generation outputs is coupled to a corresponding external terminal circuit of the plurality of external terminal circuits to generate a high voltage wake up voltage at an external terminal of the corresponding external terminal circuit, wherein each low voltage generation output of the plurality of low voltage generation outputs is coupled to a corresponding external terminal circuit of the plurality of external terminal circuits to generate a low voltage wake up voltage at an external terminal of the corresponding external terminal circuit. In another aspect, the trigger generation circuit includes a timer, wherein the trigger generation circuit asserts a signal at an output of the plurality of outputs in response to a timed count of the timer to generate a wakeup voltage at an external terminal of an external terminal circuit of the plurality corresponding to the output. In a further aspect, the timed count begins in response to an assertion of a low power indication received by the trigger generation circuit. In yet a further aspect, the low power indication is provided by a power control circuit, wherein the output signal provided by the wakeup detector, indicative of an external terminal of the plurality of external terminal circuits being placed at a wakeup voltage is provided to the power control unit. In another aspect of the above embodiment, the trigger generation circuit includes a register to receive an indication of a selected external terminal circuit of the plurality of external terminal circuits to generate a wakeup voltage at an external terminal of the selected external terminal circuit. In another aspect, each external terminal circuit of the plurality includes a switch for biasing an external terminal of the each external terminal circuit at a wake up voltage from the power supply terminal, wherein the each external terminal circuit includes a multiplexer including an output connected to a control terminal of the switch of the each external terminal circuit and including a plurality of inputs, wherein an output of the plurality of outputs of the trigger generation circuit is coupled to an input of the plurality of inputs of the multiplexer. In yet another aspect, each external terminal circuit of the plurality includes a switch for biasing an external terminal of each external terminal circuit at a wakeup voltage from the power supply terminal, wherein the assertion of a signal on an output of the plurality of outputs causes the switch to close to bias the external terminal at the wakeup voltage. In another aspect, the plurality of outputs of the trigger generation circuit includes a first plurality of outputs, each for generating a higher wakeup voltage at an external terminal of the plurality of external terminal circuits by coupling the external terminal to a first power supply voltage terminal, wherein the plurality of outputs of the trigger generation circuit includes a second plurality of outputs, each for generating a lower wakeup voltage at an external terminal of the plurality of external terminal circuits by coupling the external terminal to a second power supply voltage terminal, the second power supply voltage terminal is configured to supply a lower voltage than the first power supply terminal.

In another embodiment, a method of operating an integrated circuit includes asserting a signal on a selected output of a plurality of outputs of a trigger circuit of an integrated circuit; in response to the assertion of the signal, generating a voltage at an external terminal of a selected external terminal circuit of the integrated circuit corresponding to the selected output; wherein the generating a voltage causes a wakeup circuit of the integrated circuit to generate an indication that an external terminal of the integrated circuit is at a wakeup voltage. In one aspect of the another embodiment, the asserting occurs when at least a portion of the integrated circuit is in a low power mode, wherein the indication that an external terminal of the integrated circuit is at a wakeup voltage causes the at least a portion of the integrated circuit to exit the low power mode. In another aspect, when the at least a portion of the integrated circuit is in the low power, the selected external terminal circuit operates at a first drive strength and at a first current bias condition, wherein when the at least a portion of the integrated circuit is in a normal operating mode, the selected external terminal circuit operates at a second drive strength and at a second current bias condition, wherein the second drive strength is higher than the first drive strength and the second current bias condition is higher than the first current bias condition. In yet another aspect, the method further includes receiving a signal by the trigger circuit indicative that at least a portion of the integrated circuit is in a low power mode, wherein the asserting is performed at a predetermined time after the receiving. In a further aspect, the method further includes after receiving the signal and prior to the asserting, performing current measurement tests on the integrated circuit. In yet another aspect, the method further includes providing to the trigger circuit an indication of the selected external terminal circuit from the plurality of external terminal circuits for the asserting the signal on the selected output corresponding to the selected external terminal circuit. In another aspect, the trigger circuit includes two outputs of the plurality of outputs corresponding to the selected external terminal circuit, where a signal is asserted on a first output of the two outputs to provide a high wake up voltage at the external terminal and wherein a signal is asserted on the second output of the two outputs to provide a low wake up voltage at the external terminal, wherein prior to the asserting the signal on the selected output, the trigger circuit receives an indication of which of the two outputs is the selected output.

In yet another embodiment, an integrated circuit includes a plurality of external terminal circuits, each external terminal circuit of the plurality including an external terminal, each external terminal circuit of the plurality is coupled to two corresponding outputs of a plurality of outputs, wherein a first output of the two corresponding outputs is for generating a higher voltage at the external terminal of an external terminal circuit by coupling the external terminal to a first power supply voltage terminal of the integrated circuit and the second output of the two corresponding outputs is for generating a lower voltage at the external terminal of the external terminal circuit by coupling the external terminal to a second power supply voltage terminal that is configured to supply a lower voltage than the first power supply terminal; a wakeup detector, including a plurality of inputs, with each input of the plurality of inputs is coupled to an external terminal circuit of the plurality of external terminal circuits, wherein the wakeup detector provides an output signal indicative of an external terminal of the plurality of external terminal circuits being placed at a wakeup voltage; and a trigger generation circuit, the trigger generation circuit including the plurality of outputs, wherein the trigger generation circuit asserts a signal on an output of the plurality of outputs to generate a wakeup voltage at an external terminal of an external terminal circuit of the plurality of external terminal circuits associated with the output for the wakeup detector to receive an indication at an input of the plurality of inputs that the external terminal is at the wakeup voltage.

What is claimed is:

1. An integrated circuit comprising:
a plurality of external terminal circuits, each external terminal circuit including a corresponding external terminal;
a wakeup detector including a plurality of inputs, each input of the plurality of inputs is coupled to an external terminal circuit of the plurality of external terminal circuits, wherein the wakeup detector generates an output signal indicative of an external terminal of the plurality of external terminal circuits being placed at a wakeup voltage;
a trigger generation circuit, the trigger generation circuit including a plurality of outputs, each output of the plurality of outputs coupled to a corresponding external terminal circuit of the plurality of external terminal circuits to generate the wakeup voltage at the corresponding external terminal of the corresponding external terminal circuit by coupling the corresponding external terminal to a power supply terminal of the integrated circuit to generate an indication of the corresponding external terminal being at the wakeup voltage at the wakeup detector when at least a portion of the integrated circuit is in a low power mode,
wherein each external terminal circuit includes:
a corresponding switch for biasing the corresponding external terminal at the wakeup voltage from the power supply terminal, and
a corresponding multiplexer including an output connected to a control terminal of the corresponding switch and including a plurality of inputs, wherein a corresponding output of the plurality of outputs is coupled to an input of the plurality of inputs of the corresponding multiplexer.

2. The integrated circuit of claim 1 wherein the generation of the output signal indicative of the external terminal of the plurality of external terminal circuits being placed at the wakeup voltage causes the at least a portion of the integrated circuit to exit the low power mode.

3. The integrated circuit of claim 1 wherein when the at least a portion of the integrated circuit is in the low power, each external terminal circuit operates at a first drive strength and at a first current bias condition, wherein when the at least a portion of the integrated circuit is in a normal operating mode, the each external terminal circuit operates at a second drive strength and at a second current bias condition, wherein the second drive strength is higher than the first drive strength and the second current bias condition is higher than the first current bias condition.

4. The integrated circuit of claim 1 wherein the trigger generation circuit selectively asserts a signal on an output of the plurality of outputs to generate the wakeup voltage at the corresponding external terminal of a selected external terminal circuit of the plurality of external terminal circuits.

5. The integrated circuit of claim 1 wherein the plurality of outputs of the trigger generation circuit includes a plurality of high voltage generation outputs and a plurality of low voltage generation outputs, wherein each high voltage generation output of the plurality of high voltage generation outputs is coupled to the corresponding external terminal circuit of the plurality of external terminal circuits to generate a high voltage wake up voltage at the corresponding external terminal of the corresponding external terminal circuit, wherein each low voltage generation output of the plurality of low voltage generation outputs is coupled to the corresponding external terminal circuit of the plurality of external terminal circuits to generate a low voltage wake up voltage at the corresponding external terminal of the corresponding external terminal circuit.

6. The integrated circuit of claim 1 wherein the trigger generation circuit includes a timer, wherein the trigger generation circuit asserts a signal at an output of the plurality of outputs in response to a timed count of the timer to generate the wakeup voltage at the corresponding external terminal of a selected external terminal circuit of the plurality of external terminal circuits corresponding to the output.

7. The integrated circuit of claim 6 wherein the timed count begins in response to an assertion of a low power indication received by the trigger generation circuit.

8. The integrated circuit of claim 7 wherein the low power indication is provided by a power control circuit, wherein the output signal provided by the wakeup detector, indicative of the external terminal of the plurality of external terminal circuits being placed at the wakeup voltage, is provided to the power control unit.

9. The integrated circuit of claim 1 wherein the trigger generation circuit includes a register to receive an indication of a selected external terminal circuit of the plurality of external terminal circuits to generate the wakeup voltage at the corresponding external terminal of the selected external terminal circuit.

10. The integrated circuit of claim 1 wherein the assertion of a signal on a selected output of the plurality of outputs causes the corresponding switch in the corresponding external terminal circuit to close to bias the corresponding external terminal at the wakeup voltage.

11. The integrated circuit of claim 1 wherein the plurality of outputs of the trigger generation circuit includes a first plurality of outputs, each for generating a higher wakeup voltage at the corresponding external terminal of the plurality of external terminal circuits by coupling the corresponding external terminal to a first power supply voltage terminal, wherein the plurality of outputs of the trigger generation circuit includes a second plurality of outputs, each for generating a lower wakeup voltage at the corresponding external terminal of the plurality of external terminal circuits by coupling the corresponding external terminal to a second power supply voltage terminal, the second power supply voltage terminal is configured to supply a lower voltage than the first power supply terminal.

12. A method of operating an integrated circuit, the method comprising:
asserting a signal on a selected output of a plurality of outputs of a trigger circuit of the integrated circuit;
in response to the assertion of the signal, generating a voltage at an external terminal of a selected external terminal circuit of the integrated circuit corresponding to the selected output, wherein the external terminal is a pad of the integrated circuit;
wherein the generating a voltage causes a wakeup circuit of the integrated circuit to generate an indication that the external terminal of the integrated circuit is at a wakeup voltage,
wherein generating the voltage at the external terminal comprises:
providing the asserted signal to a first input of a plurality of inputs of a multiplexer,
in response to providing the asserted signal to the first input of the multiplexer, providing the asserted signal at an output of the multiplexer, wherein the output of the multiplexer is connected to a control terminal of a switch that is configured to bias the external terminal at the wakeup voltage from a first power supply terminal.

13. The method of claim 12, wherein the asserting occurs when at least a portion of the integrated circuit is in a low power mode, wherein the indication that the external terminal of the integrated circuit is at the wakeup voltage causes the at least a portion of the integrated circuit to exit the low power mode.

14. The method of claim 12 wherein when the at least a portion of the integrated circuit is in the low power, the selected external terminal circuit operates at a first drive strength and at a first current bias condition, wherein when the at least a portion of the integrated circuit is in a normal operating mode, the selected external terminal circuit operates at a second drive strength and at a second current bias condition, wherein the second drive strength is higher than the first drive strength and the second current bias condition is higher than the first current bias condition.

15. The method of claim 12, further comprising:
receiving a signal by the trigger circuit indicative that at least a portion of the integrated circuit is in a low power mode, wherein the asserting is performed at a predetermined time after the receiving.

16. The method of claim 15 further comprising:
after receiving the signal and prior to the asserting, performing current measurement tests on the integrated circuit.

17. The method of claim 12 further comprising:
providing to the trigger circuit an indication of the selected external terminal circuit from a plurality of external terminal circuits for the asserting the signal on the selected output corresponding to the selected external terminal circuit.

18. The method of claim 12 wherein the trigger circuit includes two outputs of the plurality of outputs corresponding to the selected external terminal circuit, where a signal is asserted on a first output of the two outputs to provide a high wake up voltage at the external terminal and wherein a signal is asserted on the second output of the two outputs to provide a low wake up voltage at the external terminal, wherein prior to the asserting the signal on the selected output, the trigger circuit receives an indication of which of the two outputs is the selected output.

19. An integrated circuit comprising:
a plurality of external terminal circuits, each external terminal circuit of the plurality of external terminal circuits including a corresponding external terminal, each external terminal circuit is coupled to two corresponding outputs of a plurality of outputs, wherein a first output of the two corresponding outputs is for generating a higher voltage at the corresponding external terminal of an external terminal circuit by coupling the corresponding external terminal to a first power supply voltage terminal of the integrated circuit and the second output of the two corresponding outputs is for generating a lower voltage at the corresponding external terminal of the external terminal circuit by coupling the corresponding external terminal to a second power supply voltage terminal that is configured to supply a lower voltage than the first power supply terminal;
a wakeup detector, including a plurality of inputs, with each input of the plurality of inputs coupled to a corresponding external terminal circuit of the plurality of external terminal circuits, wherein the wakeup detector provides an output signal indicative of an external terminal of the plurality of external terminal circuits being placed at a wakeup voltage;
a trigger generation circuit, the trigger generation circuit including the plurality of outputs, wherein the trigger generation circuit asserts a signal on an output of the plurality of outputs to generate the wakeup voltage at the corresponding external terminal of a selected external terminal circuit of the plurality of external terminal circuits for the wakeup detector to receive an indication at an input of the plurality of inputs that the corresponding external terminal of the selected external terminal circuit is at the wakeup voltage,
wherein each external terminal circuit includes:
a corresponding first switch for biasing the corresponding external terminal at the wakeup voltage from the first power supply voltage terminal,
a corresponding second switch for biasing the corresponding external terminal at the wakeup voltage from the second power supply voltage terminal,
a corresponding first multiplexer including an output connected to a control terminal of the corresponding first switch and including a first plurality of inputs, wherein a corresponding first output of the plurality of outputs of the trigger generation circuit is coupled to an input of the first plurality of inputs of the corresponding first multiplexer, and a corresponding second multiplexer including an output connected to a control terminal of the corresponding second switch and including a second plurality of inputs, wherein a corresponding second output of the plurality of outputs of the trigger generation circuit is coupled to an input of the second plurality of inputs of the corresponding second multiplexer.

* * * * *